United States Patent
Borkenhagen et al.

(10) Patent No.: US 11,558,057 B1
(45) Date of Patent: Jan. 17, 2023

(54) PHASE LOCKED LOOP PULSE TRUNCATION

(71) Applicant: International Business Machines Corporation, Armonk, NY (US)

(72) Inventors: John Borkenhagen, Rochester, MN (US); Grant P. Kesselring, Rochester, MN (US); James Strom, Rochester, MN (US); Christopher Steffen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/519,438

(22) Filed: Nov. 4, 2021

(51) Int. Cl.
  *H03L 7/089* (2006.01)
  *H03K 3/017* (2006.01)
  *H03K 5/133* (2014.01)

(52) U.S. Cl.
  CPC ........... *H03L 7/0891* (2013.01); *H03K 3/017* (2013.01); *H03K 5/133* (2013.01)

(58) Field of Classification Search
  CPC ....... H03L 7/0891; H03K 3/017; H03K 5/133
  See application file for complete search history.

(56) References Cited

U.S. PATENT DOCUMENTS

| | | | |
|---|---|---|---|
| 5,604,775 A | 2/1997 | Saitoh | |
| 5,910,740 A | 6/1999 | Underwood | |
| 6,239,632 B1 | 5/2001 | Moyal | |
| 7,816,958 B2 | 10/2010 | Sundby | |
| 8,164,369 B2 | 4/2012 | Raghunathan | |
| 9,503,105 B2 | 11/2016 | Mirajkar | |
| 10,855,292 B2 | 12/2020 | Kuan | |
| 10,924,123 B2 | 2/2021 | Sahu | |
| 11,469,670 B2* | 10/2022 | Pahkala | H02M 3/157 |
| 2005/0052252 A1 | 3/2005 | Galibois | |
| 2006/0034403 A1 | 2/2006 | Huang | |
| 2012/0063546 A1 | 3/2012 | Kobayashi | |
| 2018/0048322 A1 | 2/2018 | Katyal | |

OTHER PUBLICATIONS

A Novel Phase Frequency Detector for a High Frequency PLL Design, A. Majeed, et al., International Conference on Design and Manufacturing, IConDM 2013, 2013.

(Continued)

*Primary Examiner* — Cassandra F Cox
(74) *Attorney, Agent, or Firm* — Matthew Zehrer

(57) ABSTRACT

A phase locked loop includes a pulse limiter between a phase frequency detector and a charge pump. The phase frequency detector generates and sends a clock pulse to the pulse limiter. The pulse limiter generates a first signal that indicates that the clock pulse is greater than a minimum pulse width of the phase frequency detector. The pulse limiter receives a pulse limiter buffer selection signal that selects one buffer of a plurality of buffers within the pulse limiter. The pulse limiter generates a second signal that indicates a truncated pulse width as the minimum pulse width of the phase frequency detector plus a delay period that is associated with the pulse limiter buffer selection signal. The pulse limiter truncates the clock pulse to the truncated pulse width and sends the truncated clock pulse to the charge pump.

8 Claims, 7 Drawing Sheets

(56) References Cited

OTHER PUBLICATIONS

Charge Pump Phase-Locked Loop With Phase-Frequency Detector: Closed Form Mathematical Model, N. Kuznetsov, et al., Mar. 10, 2019.

Design of Improved CMOS Phase-Frequency Detector and Charge-Pump for Phase-Locked Loop, Liu Faen, et al., Journal of Semiconductors, vol. 35, No. 10, Oct. 2014.

Fast Charge Pump Circuit for PLL Using 50nm CMOS Technology, Y. Singh, et al., International Journal of Advanced Research in Computer and Communication Engineering, vol. 2, Issue 7, Jul. 2013.

Phase Frequency Detector and Charge Pump for Low Jitter PLL Applications, S. Park, et al., International Journal of Electrical and Computer Engineering (IJECE), vol. 8, No. 6, Dec. 2018.

* cited by examiner

PHASE LOCKED LOOP PULSE TRUNCATION

BACKGROUND

Various embodiments of the present application generally relate to an electronic system that includes a processing unit, such as a processor, integrated circuit (IC), or the like and more specifically relates to a phase locked loop (PLL) that truncates INC and DEC pulses that are received from the PLL phase frequency detector.

SUMMARY

In an embodiment of the present invention, a phase locked loop pulse truncation method is presented. The method includes receiving, with a pulse limiter circuit, a delay buffer selection that indicates a delay period. The method further includes receiving, with the pulse limiter circuit, a pulse from a phase frequency detector. The method further includes determining, with the pulse limiter circuit, whether a width of the received pulse is greater than the phase frequency detector minimum pulse width plus the delay period. The method further includes truncating, with the pulse limiter circuit, the pulse. The method further includes sending, with the pulse limiter circuit, the truncated pulse to a charge pump.

In an embodiment of the present invention, a phase locked loop is presented. The phase locked loop includes a phase frequency detector that generates and is adapted to send a clock pulse to a pulse limiter. The pulse limiter is adapted to generate a first signal that indicates that the clock pulse is greater than a minimum pulse width of the phase frequency detector. The pulse limiter is adapted to receive a pulse limiter buffer selection signal that selects one buffer of a plurality of buffers within the pulse limiter. The pulse limiter is adapted to generate a second signal that indicates a truncated pulse width as the minimum pulse width of the phase frequency detector plus a delay period that is associated with the pulse limiter buffer selection signal. The pulse limiter is adapted to truncate the clock pulse to the truncated pulse width. The pulse limiter is further adapted to send the truncated clock pulse to a charge pump.

In an embodiment of the present invention, a phase locked loop is presented. The phase locked loop includes a first delay element that receives a UP_PRE clock pulse from a phase frequency detector and a second delay element that receives a DWN_PRE clock pulse from the phase frequency detector. The phase locked loop includes a XOR gate that receives the UP_PRE clock pulse and the DWN_PRE clock pulse and generates an XOR output that indicates if UP_PRE clock pulse or the DWN_PRE is greater than a minimum pulse width of the phase frequency detector. The phase locked loop includes a plurality of delay buffers electrically connected in series to the XOR gate. The phase locked loop includes a multiplexer that outputs a delay stage signal that indicates a truncated pulse width as the minimum pulse width of the phase frequency detector plus a delay period that is associated with a delay buffer selection signal that identifies one of the plurality of delay buffers. The phase locked loop includes a first AND gate, electrically connected to the first delay element, that outputs a truncated UP clock pulse comprising the truncated pulse width to a charge pump. The phase locked loop includes a second AND gate, electrically connected to the second delay element, that outputs a truncated DWN clock pulse comprising the truncated pulse width to the charge pump.

These and other embodiments, features, aspects, and advantages will become better understood with reference to the following description, appended claims, and accompanying drawings.

Figure 1:
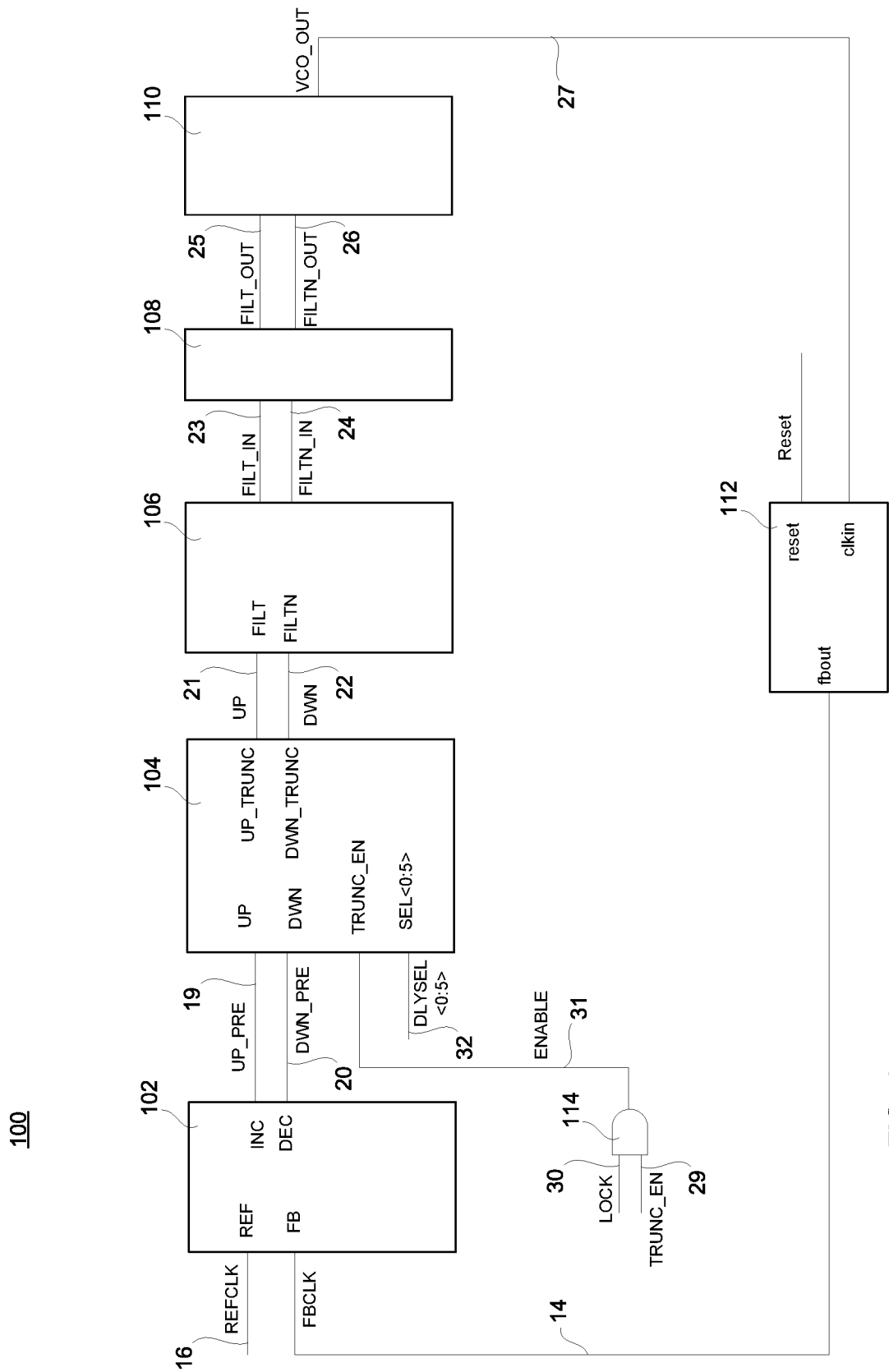
FIG. 1 is a block diagram illustrating a phase locked loop that includes a pulse limiter, in accordance with one or more embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method, or device. Finally, like reference numerals may be used to denote like features throughout the specification and figures.

DETAILED DESCRIPTION

Computer processing units often obtain their clock source from an external crystal oscillator chip. Errors associated with the oscillator clock signal may impact reliability of the processing unit, itself, and/or a higher level computer system that utilizes the processing unit. As such, these computer processing units may include a phase locked loop in attempt to synchronize, filter, etc. the oscillator clock signal and/or minimize the impact of the error. Ultimately, this error could lead to the computer system to fail, could necessitate a reboot, or the like. Recovering from such down time adversities may be time consuming and may be costly if associated business operations are adversely affected. Therefore, a redundant clock switch (RCS) may be provided. The RCS provides a reference clock output to the processing unit. Initially, the reference clock is generated from a first oscillator clock signal. If the RCS detects an error associated with the first oscillator clock signal, the RCS generates the reference clock output from a second redundant oscillator clock signal. As such, adversities due to an oscillator clock signal error may be reduced or avoided.

A typical RCS includes two independent clock sources and a circuit to align and switch between the two independent clock sources. If the independent clock sources are not perfectly aligned, this switch-over event can cause unwanted jitter to trickle into the phase lock loop and cause further errors. A known RCS includes a complex analog circuit to align two clock sources within 312.5 ps. Due to the 312.5 ps of clock phase uncertainty, the phase locked loop must be configured in a low gain operational environment to combat a possible 312.5 ps of transient noise or jitter that may occur, for example, during the switch-over event. However, this is not ideal since phase locked loops that are configured for low gain are generally more susceptible to noise. Therefore, there is a need for a phase locked loop to response to noise without the need to be configured for a low gain operational environment.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, circuits, or the like, have not been described in exhaustive detail so as not to unnecessarily obscure more pertinent aspects of the embodiments described herein.

FIG. 1 illustrates a block diagram of a phase locked loop (PLL) 100 may include a phase frequency detector 102, a pulse limiter 104, a charge pump 106, a loop filter 108, a voltage controlled oscillator (VCO) 110, and/or a feedback divider 112, in accordance with embodiments of the present invention. The phase frequency detector 102 is electrically connected to the pulse limiter 104. The pulse limiter 104 is electrically connected to the charge pump 106. The charge pump 106 is electrically connected to the loop filter 108. The loop filter 108 is electrically connected to the VCO 110. The VCO 11 is electrically connected to the feedback divider 112. The feedback divider 112 is electrically connected to the phase frequency detector 102.

The phase frequency detector 102 compares a phase and frequency of a reference clock signal 16 to a phase and frequency of a feedback clock signal 14 from the feedback divider 112. The phase frequency detector 102 generates an output comprising an UP_PRE pulse 19 and a DWN_PRE pulse 20. The UP_PRE pulse 19 may also be referred to as an increment (INC) pulse, or the like. Similarly, the DWN_PRE pulse 20 may also be referred to as an decrement (DEC) pulse, or the like.

The UP_PRE pulse 19 and the DWN_PRE pulse 20 represent a phase and frequency difference between the reference clock signal 16 and the feedback clock signal 14. When a phase of the feedback clock signal 14 is lagging a phase of the reference clock signal 16, a pulse width of the UP_PRE pulse 19 is set wider than a pulse width of the DWN_PRE pulse 20. When a phase of the feedback clock signal 14 is leading a phase of the reference clock signal 16, the pulse width of the DWN_PRE pulse 20 is set wider than the pulse width of the UP_PRE pulse 19. When a phase of the feedback clock signal 14 is about equal to a phase of the reference clock signal 16, the pulse width of the DWN_PRE pulse 20 is about equal to the pulse width of the UP_PRE pulse 19. In this case, the pulse width of both UP_PRE pulse 19 and DWN_PRE pulse 20 is defined to be "the minimum pulse width" generated by a phase frequency detector 102.

The pulse limiter 104 may reduce, limit, or otherwise truncate the UP_PRE pulse 19 and DWN_PRE pulse 20 generated by the phase frequency detector 102. The pulse limiter 104 generates an output comprising a UP pulse 21 and a DWN pulse 22. The UP pulse 21 may also be referred to as a INC pulse, or the like. Similarly, the DWN pulse 22 may also be referred to as a DEC pulse, or the like.

When the pulse limiter 104 truncates the UP_PRE pulse 19 and DWN_PRE pulse 20, the PLL 100 has a filtered, limited, suppressed, or throttled response to transient noise, and thus lower PLL gain. Truncation by the pulse limiter 104 can be disabled by a TRUNC_EN signal 29 and/or a LOCK signal 30 to an AND gate 114. That is, truncation by the pulse limiter 104 occurs when both TRUNC_EN signal 29 and LOCK signal 30 indicate that truncation is to occur (e.g., TRUNC_EN signal 29 is high "1" and LOCK signal 30 is high "1"). TRUNC_EN signal 29 may be generated by, for example, pervasive register(s) or latche(s) which may be controlled external to the phase locked loop 100. LOCK signal 30 may be generated by, for example, a known lock detector that may be internal to the phase locked loop 100 and indicates when PLL 100 is locked. AND gate 114 generates an enable 31 signal that indicates whether or not truncation is to occur.

Figure 2:
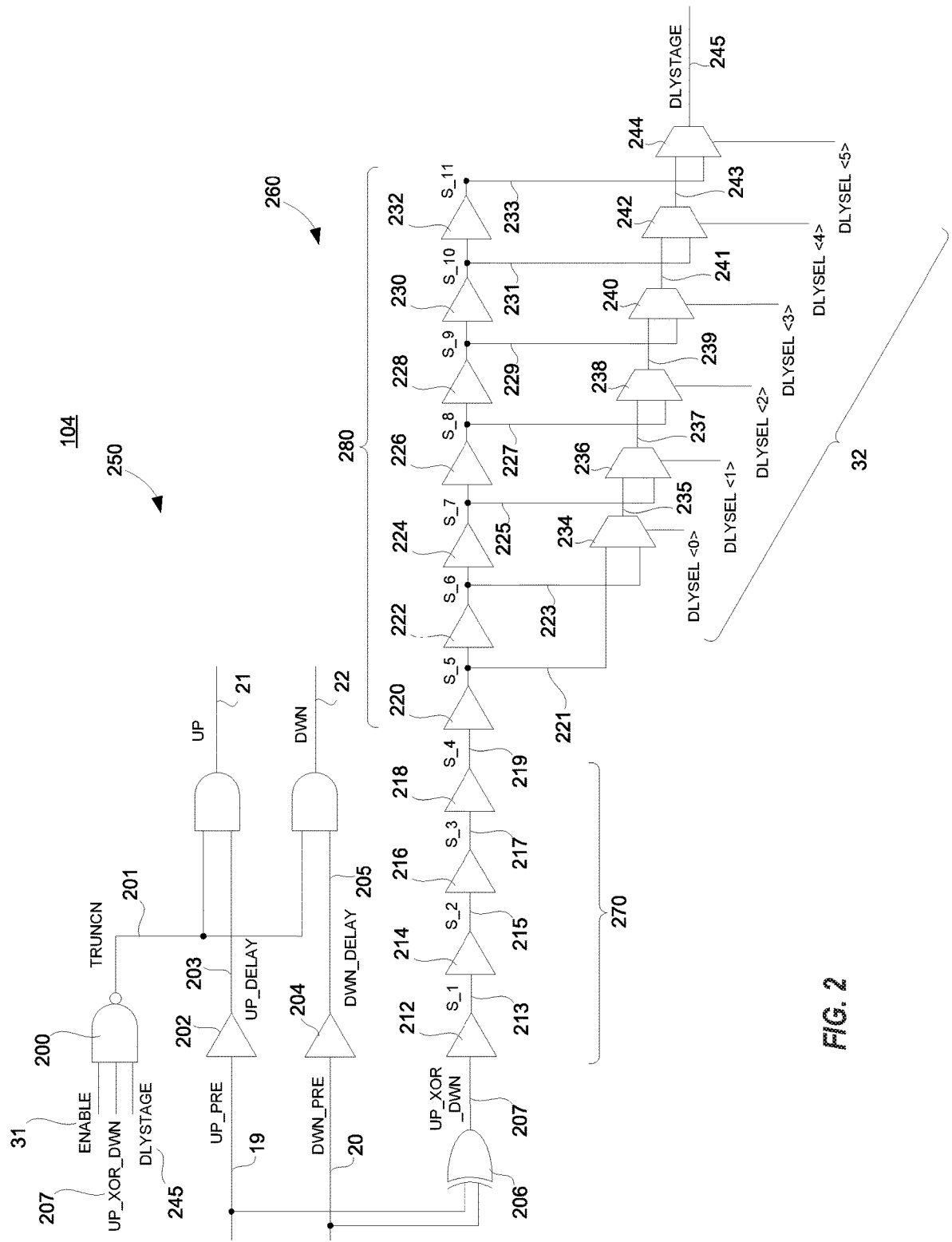
FIG. 2 is a block logic diagram illustrating a pulse limiter, in accordance with one or more embodiments.

Truncation by the pulse limiter 104 can be configurable (i.e., the pulse width of the truncated UP signal 21 and the truncated DWN signal 22 may be indicated) based on a delay element selection as is indicated by delay select 32 signal. Delay select 32 signal indicates a quantity or number of a series of delay elements of pulse limiter 104 to which UP_XOR_DWN signal 207, as is exemplarily shown in FIG. 2, is delayed.

Truncation may be disabled when PLL 100 is converging to its locked state and enabled when PLL 100 is locked. This allows for normal gain operation when the PLL 100 is converging and low gain (i.e., truncated) operation (e.g., able to filter out transient noise, etc.) when PLL 100 is locked. In other words, UP pulse 21 and/or DWN pulse 22 may not be truncated, relative to UP_PRE pulse 19 and DWN_PRE pulse 20, respectively, (e.g., the pulse width of UP_PRE pulse 19 is about equal to the pulse width of UP pulse 21 and/or the pulse width of DWN_PRE pulse 20 is about equal to the pulse width of DWN pulse 22) during PLL 100 convergence to its locked state. Likewise, UP pulse 21 and/or DWN pulse 22 may be truncated, relative to UP_PRE pulse 19 and DWN_PRE pulse 20, (e.g., the pulse width of UP_PRE pulse 19 is wider than the pulse width of UP pulse 21 and/or the pulse width of DWN_PRE pulse 20 is wider than the pulse width of DWN pulse 22) when PLL 100 is locked.

In embodiments, the pulse limiter 104 comprises a single block or single series of delay elements to truncate the UP_PRE pulse 19 and DWN_PRE pulse 20, and combinational logic elements 250 to propagate the phase frequency detector 102 minimum phase pulse width. The single block or single series of delay elements may truncate both the UP_PRE pulse 19 and DWN_PRE pulse 20, while other known truncation systems may include a dedicated subsystem to independently truncate INC pulses and DEC pulses, respectively. As such, the single block or single series of delay elements of the pulse limiter 104 may reduce the size of known truncation systems by half.

Further, the propagation of the phase frequency detector 102 minimum phase pulse width by pulse limiter 104 may reduce the number of delay elements by an additional 2N (where N is the number of delay elements in the phase frequency detector 102), when compared to a prior art phase locked loop. In the phase locked loop 100, combinational logic elements 250 may ensure the phase frequency detector 102 minimum pulse width is left un-truncated which reduces an overall number of delay elements. More specifically, XOR gate 206 that generates UP_XOR_DWN 207 and the NAND gate 200 that generates TRUNCN 201 may ensure the phase frequency detector 102 minimum pulse width is left un-truncated. If UP_PRE pulse 19 and DWN PRE pulse 20 are both true, high, "1", or the like then truncation may not occur, as indicated by XOR gate 206. As such, both UP_PRE pulse 19 and DWN_PRE pulse 20 will be high during the phase frequency detector 102 minimum pulse width. Generally, all phase frequency detectors have a minimum pulse width to ensure the charge pump is actively stimulated. In prior art phase locked loops, the pulse limiter circuit typically truncates the entire INC pulse or DEC pulse, including the portion that is the minimum pulse width. To combat this, prior art phase locked loops include at least N number of delay elements, which is a replica of the N delay elements in the phase frequency detectors (which generates the minimum pulse width). That way, prior art phase locked loops' pulse limiting circuits ensure the minimum phase frequency detector pulse width propagates through untouched (phase frequency detector delay elements=pulse limiter delay elements). Then the prior art phase locked loop typically includes an additional M delay elements to truncate anything over the minimum pulse width. Giving a total of N+M delay elements. To truncate both the INC pulse and the DEC pulse, the prior art phase locked loops typically double the number such delay elements (N+M).

The use of the single block or single series of delay elements of the pulse limiter 104 also may eliminate transistor mismatch. The prior art phase locked loops typically contain a dedicated INC pulse limiter block and a separate dedicated DEC pulse limiter block. In this configuration, there can be transistor mismatch between the two identical blocks caused by physical fabrication. The time-delay through the delay elements could vary between the two blocks and cause the INC pulse to be truncated more than DEC pulse, or vice versa, for the same pulse width setting. The UP and DWN signals that go to the charge pump typically need to be falling-edge aligned and having two separate limiter blocks makes that such alignment difficult and transistor mismatch more pervasive. Here, phase locked loop 100 uses one single grouping of delay elements 260 to truncate both the UP pulse and the DWN pulse which reduces or eliminates such transistor mismatches.

The UP pulse 21 and the DWN pulse 22 are transmitted to the charge pump 106. The UP pulse 21 and the DWN pulse 22 control the charge pump 106 to source or sink a FILT_IN 23 signal and an inverted FILTN_IN 24 signal to/from the loop filter 108. Based on an amount and the direction (i.e., source or sink) of the FILT_IN 23 signal and the FILTN_IN 24 signal, the loop filter 108 produces a control FILT_OUT 25 signal and an control inverted FILTN_OUT 26 signal.

The FILT_OUT 25 signal and the FILTN_OUT 26 signal controls the VCO 110 to produce an output VCO_OUT 27 signal that tracks the reference clock signal 16 (i.e., VCO_OUT 27 signal tracks a phase and frequency of the reference clock signal 16). Generally, the PLL circuit 100 is referred to as "locked" when the VCO_OUT 27 signal tracks the phase and frequency of the reference clock signal 16. Due to process mismatch, circuit performance, a small difference may exist between a phase of the VCO_OUT 27 signal and a phase of the reference clock signal 16, even when the PLL 100 is locked.

In some embodiments, VCO_OUT 27 signal is the feedback clock signal 14 (i.e., PLL 100 does not contain feedback divider 112). In other embodiments, feedback divider 112 may divide the VCO_OUT 27 to generate the feedback clock signal 14.

FIG. 2 is a block logic diagram illustrating pulse limiter 104, in accordance with one or more embodiments. Pulse pulse limiter 104 may include a single block 260 of a series buffers and combinational logic elements 250 to propagate the phase frequency detector 102 minimum phase pulse width.

The UP_PRE pulse 19 may be sent through buffer 202 to create a UP_DELAY pulse 203 and the DWN_PRE pulse 20 may be sent through buffer 204 to create a DWN_DELAY pulse 205, so as to achieve proper or adequate timing with the combinational logic elements 250.

One combinational logic element 250 may be an XOR gate 206. XOR gate 206 may generate a UP_XOR_DWN signal 207. UP_XOR_DWN signal 207 may be used to indicate anytime or any instance the phase frequency detector 102 generates a pulse greater than the minimum pulse width.

UP_XOR_DWN signal 207 may be sent through N delay buffers, where N is selectable, as indicated by delay select 32 signal, to indicate a selected multiplexer amongst a plurality of possibility multiplexers for the multiplexer output signal (e.g., signal 235, 237, 239, 241, 243, etc.) to be selected as a delayed DLYSTAGE signal 245. The delayed DLYSTAGE signal 245 is used to indicate that the pulse is greater than our desired pulse width as indicated by DLYSEL[0:5] delay select 32 signal. In the example depicted, pulse limiter 104 includes delay buffers 212, 214, 216, 218, 220, 222, 224, 226, 228, 230, and 232 and includes multiplexers 234, 236, 238, 240, 242, and 244.

In the exemplary depiction, XOR gate 206 may be electrically connected in series to buffer 212. XOR gate 206 may send UP_XOR_DWN signal 207 to buffer 212 which delays UP_XOR_DWN signal 207 and generates a stage one buffer output signal 213. Buffer 212 may be electrically connected in series to buffer 214. Buffer 212 may send the stage one buffer output signal 213 to buffer 214 which delays this received signal and generates a stage two buffer output signal 215. Buffer 214 may be electrically connected in series to buffer 216. Buffer 214 may send the stage two buffer output signal 215 to buffer 216 which delays this received signal and generates a stage three buffer output signal 217. Buffer 216 may be electrically connected in series to buffer 218. Buffer 216 may send the stage three buffer output signal 217 to buffer 218 which delays this received signal and generates a stage four buffer output signal 219. Buffer 218 may be electrically connected in series to buffer 220. Buffer 218 may send the stage four buffer output signal 219 to buffer 220 which delays this received signal and generates a stage five buffer output signal 221.

Further in the exemplary depiction, buffer 220 may be electrically connected in series to buffer 222. Buffer 220 may send the stage five buffer output signal 221 to buffer 222 which delays this received signal and generates a stage six buffer output signal 223. Buffer 220 may be further electrically connected in parallel to multiplexer 234. Buffer 220 may send the stage five buffer output signal 221 to multiplexer 234. Buffer 222 may be electrically connected in series to buffer 224. Buffer 222 may send the stage six buffer output signal 223 to buffer 224 which delays this received signal and generates a stage seven buffer output signal 225. Buffer 222 may be further electrically connected in parallel to multiplexer 234. Buffer 222 may send the stage six buffer output signal 223 to multiplexer 234. Upon receipt of a DLYSEL<0> signal, multiplexer 234 outputs either the received the stage five buffer output signal 221 or the stage six buffer output signal 223 as a multiplexer output signal 235 to multiplexer 236.

Further in the exemplary depiction, buffer 224 may be electrically connected in series to buffer 226. Buffer 224 may send the stage seven buffer output signal 225 to buffer 226 which delays this received signal and generates a stage eight buffer output signal 227. Buffer 224 may be further electrically connected in parallel to multiplexer 236. Buffer 224 may send the stage seven buffer output signal 225 to multiplexer 236. Upon receipt of a DLYSEL<1> signal, multiplexer 236 outputs either the received the multiplexer output signal 235 or the stage seven buffer output signal 225 as a multiplexer output signal 237 to multiplexer 238.

Further in the exemplary depiction, buffer 226 may be electrically connected in series to buffer 228. Buffer 226 may send the stage eight buffer output signal 227 to buffer 228 which delays this received signal and generates a stage nine buffer output signal 229. Buffer 226 may be further electrically connected in parallel to multiplexer 238. Buffer 226 may send the stage eight buffer output signal 227 to multiplexer 238. Upon receipt of a DLYSEL<2> signal, multiplexer 238 outputs either the received the multiplexer output signal 237 or the stage eight buffer output signal 227 as a multiplexer output signal 239 to multiplexer 240.

Further in the exemplary depiction, buffer 228 may be electrically connected in series to buffer 230. Buffer 228 may send the stage nine buffer output signal 229 to buffer 230 which delays this received signal and generates a stage ten buffer output signal 231. Buffer 228 may be further electrically connected in parallel to multiplexer 240. Buffer 228 may send the stage nine buffer output signal 229 to multiplexer 240. Upon receipt of a DLYSEL<3> signal, multiplexer 240 outputs either the received the multiplexer output signal 239 or the stage nine buffer output signal 229 as a multiplexer output signal 241 to multiplexer 242.

Further in the exemplary depiction, buffer 230 may be electrically connected in series to buffer 232. Buffer 230 may send the stage ten buffer output signal 231 to buffer 232 which delays this received signal and generates a stage eleven buffer output signal 233. Buffer 230 may be further electrically connected in parallel to multiplexer 242. Buffer 230 may send the stage ten buffer output signal 231 to multiplexer 240. Upon receipt of a DLYSEL<4> signal, multiplexer 242 outputs either the received the multiplexer output signal 241 or the stage ten buffer output signal 231 as a multiplexer output signal 243 to multiplexer 244.

Further in the exemplary depiction, buffer 232 may be electrically connected in parallel to multiplexer 244. Buffer 232 may send the stage eleven buffer output signal 233 to multiplexer 244. Upon receipt of a DLYSEL<5> signal, multiplexer 244 outputs either the received the multiplexer output signal 243 or the stage eleven buffer output signal 233 as a delayed DLYSTAGE signal 245.

Another combinational logic element 250 may be NAND gate 200. NAND gate 200 may NAND the delayed DLYSTAGE signal 245, the enable signal 31, and UP_X-OR_DWN signal 207 to generate a not truncate signal 201.

Yet other combinational logic elements 250 may be AND gate 208 and AND gate 210. AND gate 208 may logically AND the not truncate signal 201 and the UP_DELAY pulse 203 to generate the UP pulse 21. Similarly, AND gate 210 may logically AND the not truncate signal 201 and the DWN_DELAY pulse 205 to generate the DWN pulse 22.

In the exemplary depiction, pulse limiter 104 truncates both the UP_PRE pulse 19 and the DWN_PRE pulse 20 when the following three criteria are met: (1) Enable signal 31 indicates that truncation is enabled. For example, enable signal 31 is true, high, "1", or the like, (2) Either UP_PRE pulse 19 or DWN_PRE pulse 20 are true, high, "1", or the like, but not both, for a time greater than a number of delay element(s) within the one or more delay buffers 280. For example, phase frequency detector 102 outputs a UP_PRE pulse 19 and/or a DWN_PRE pulse 20 that is wider than the minimum pulse width, and (3) either the UP_DELAY pulse 203 or the DWN_DELAY pulse 205 is true, high, "1", or the like, prior to both UP_PRE pulse 19 and DWN_PRE pulse 20 going true, high, "1", or the like. For example, the UP_PRE pulse 19 and/or a DWN_PRE pulse 20 is greater or wider than the minimum pulse with plus a delay associated with a selected buffer that is amongst the single block 260 or series of delay elements.

For clarity, pulse limiter 104 allows truncation of both the UP_PRE pulse 19 and the DWN_PRE pulse 20 with a single block 260 or series of delay elements or buffers (e.g., buffers 212, 214, 216, 218, 220, 222, 224, 226, 228, 230, and/or 232), as opposed to a dedicated block or series of delay elements for truncation of an INC pulse and a different dedicated block or series of delay elements for truncation of an DWN pulse. This not only reduces the number of required total delay elements in the phase locked loop, but also eliminates the concern of transistor mismatch for UP and DWN truncated signals.

For further clarity, the single block 260 or series of delay elements may include one or more delay buffers 270 that may not be individually selectable by way of delay select 32 signal and one or more delay buffers 280 that may be individually selectable by way of delay select 32 signal.

For further clarity, pulse limiter 104 allows the phase frequency detector 102 minimum pulse width to propagate through the circuit un-truncated, when advantageous, that may allow for proper charge within loop filter 108.

Figure 3:
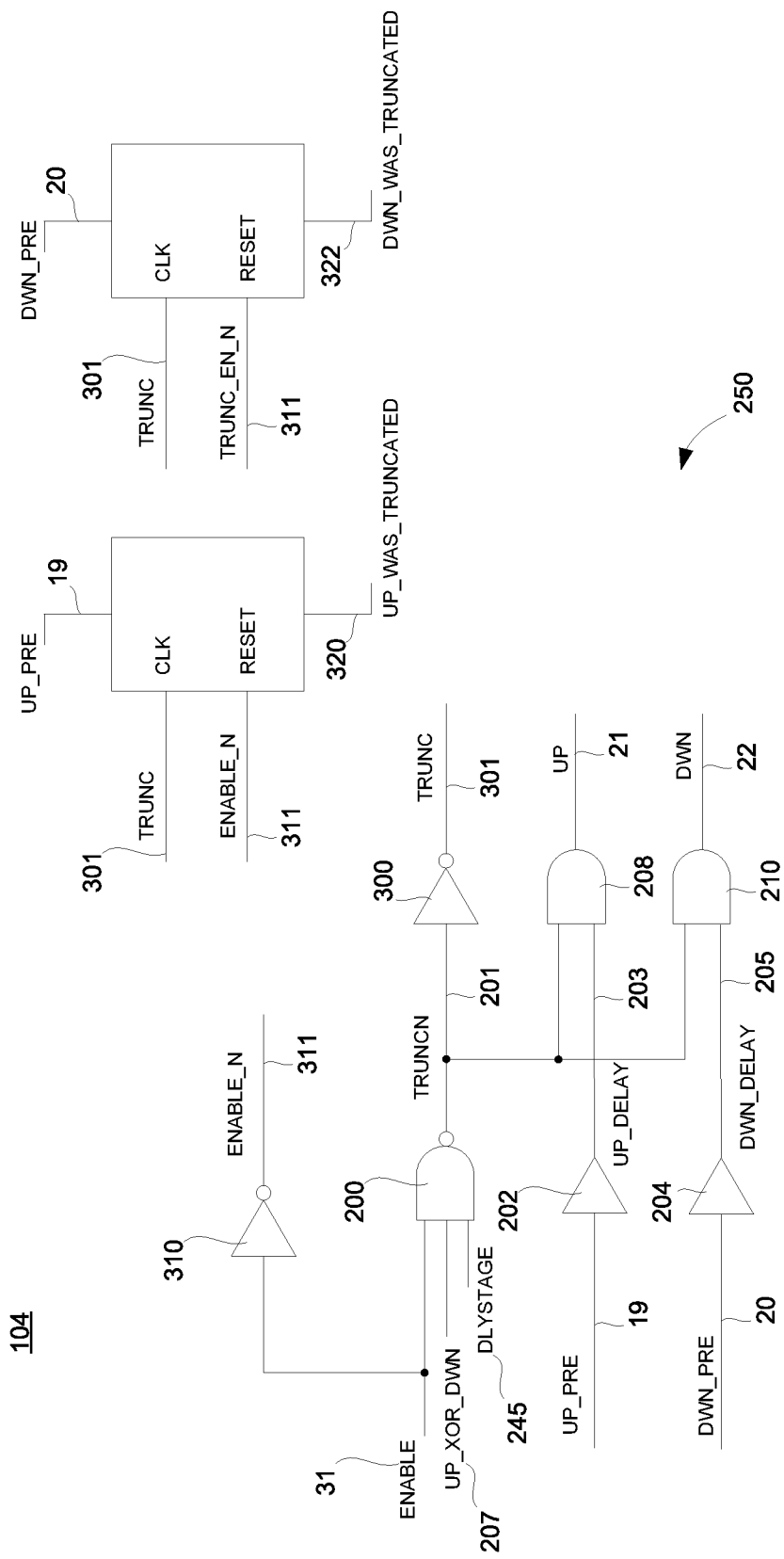
FIG. 3 is a block logic diagram illustrating features of a pulse limiter, in accordance with one or more embodiments.

FIG. 3 is a block logic diagram illustrating features of pulse limiter 104, in accordance with one or more embodiments. In some embodiments, pulse limiter 104 may further include latch 331 and latch 333. Latch 331 may determine and indicate whether UP_PRE pulse 19 was truncated and latch 333 may determine and indicate whether DWN_PRE pulse 20 was truncated. Latch 331 and latch 333 can effectively identify which and/or when signal or when UP_PRE pulse 19 and/or DWN_PRE pulse 20 were truncated.

Pulse limiter 104 may further include inverted buffer 300 and inverted buffer 310. Inverted buffer 300 may be electrically connected to NAND gate 200 and may receive and delay TRUNCN signal 201 and further logically invert the TRUNCN signal 201 to TRUNC signal 301. Inverted buffer 310 may be electrically connected to AND gate 114 and may receive and delay enable signal 31 and further logically invert the enable signal 31 to a not_enable signal 311.

Latch 331 may be electrically connected to inverted buffer 300 and may receive the TRUNC signal 301 therefrom. Latch 331 may further be electrically connected to inverted buffer 310 and may receive the not_enable signal 311 therefrom. Latch 331 may further be electrically connected the phase frequency detector 102 and may receive the UP_PRE pulse 19 therefrom. Latch 331 may be clocked by the rising edge of TRUNC signal 301 and the data input may be the UP_PRE pulse 19. As such, the data input will be latched when TRUNC signal 301 is true, high, "1", or the like. Consequently, an output UP_WAS_TRUNCATED signal 320 reflects that UP_PRE pulse 19 was truncated. The UP_WAS_TRUNCATED signal 320 can be used by an external component to, for example, determine if phase locked loop 100 should speed up or slow down, or the like.

Similarly, latch 333 may be electrically connected to inverted buffer 300 and may receive the TRUNC signal 301 therefrom. Latch 333 may further be electrically connected to inverted buffer 310 and may receive the not_enable signal 311 therefrom. Latch 333 may further be electrically connected the phase frequency detector 102 and may receive the DWN_PRE pulse 20 therefrom. Latch 333 may be clocked by the rising edge of TRUNC signal 301 and the data input may be the DWN_PRE pulse 20. As such, the data input may be latched when TRUNC signal 301 is true, high, "1", or the like. Consequently, an output DWN_WAS_TRUNCATED signal 322 reflects that DWN_PRE pulse 20 was truncated. The DWN_WAS_TRUNCATED signal 322 can be used by an external component to, for example, determine if phase locked loop 100 should speed up or slow down, or the like.

Figure 4:
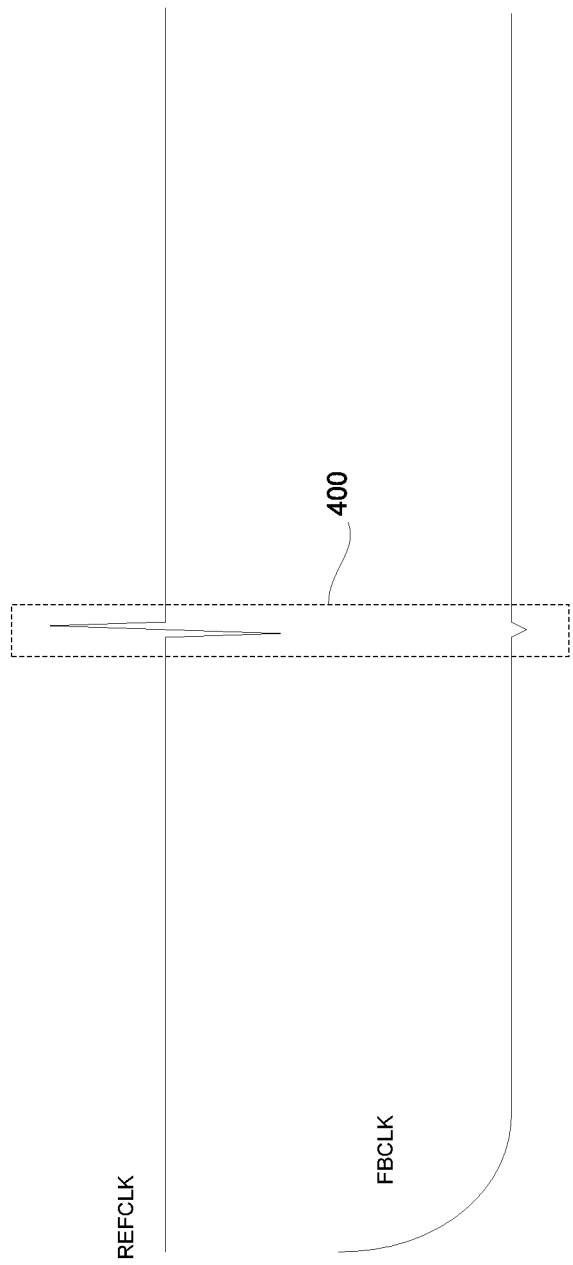
FIG. 4 is a waveform diagram of an REFCLK signal received by a phase locked loop and a FBCLK signal from the phase locked loop, in accordance with one or more embodiments.

FIG. 4 is an exemplary frequency diagram of an REFCLK signal 16 and of a FBCLK signal 14 from the phase look loop, in accordance with one or more embodiments. The frequency diagram depicts an exemplary phase locked loop 100 response to a single cycle 1 nanosecond REFCLK signal 16 pulse extension. Such event may be similar to for example, a switch-over event. A region 400 defines a time region of exemplary phase locked loop 100 waveform response(s) depicted in FIG. 5.

Figure 5:
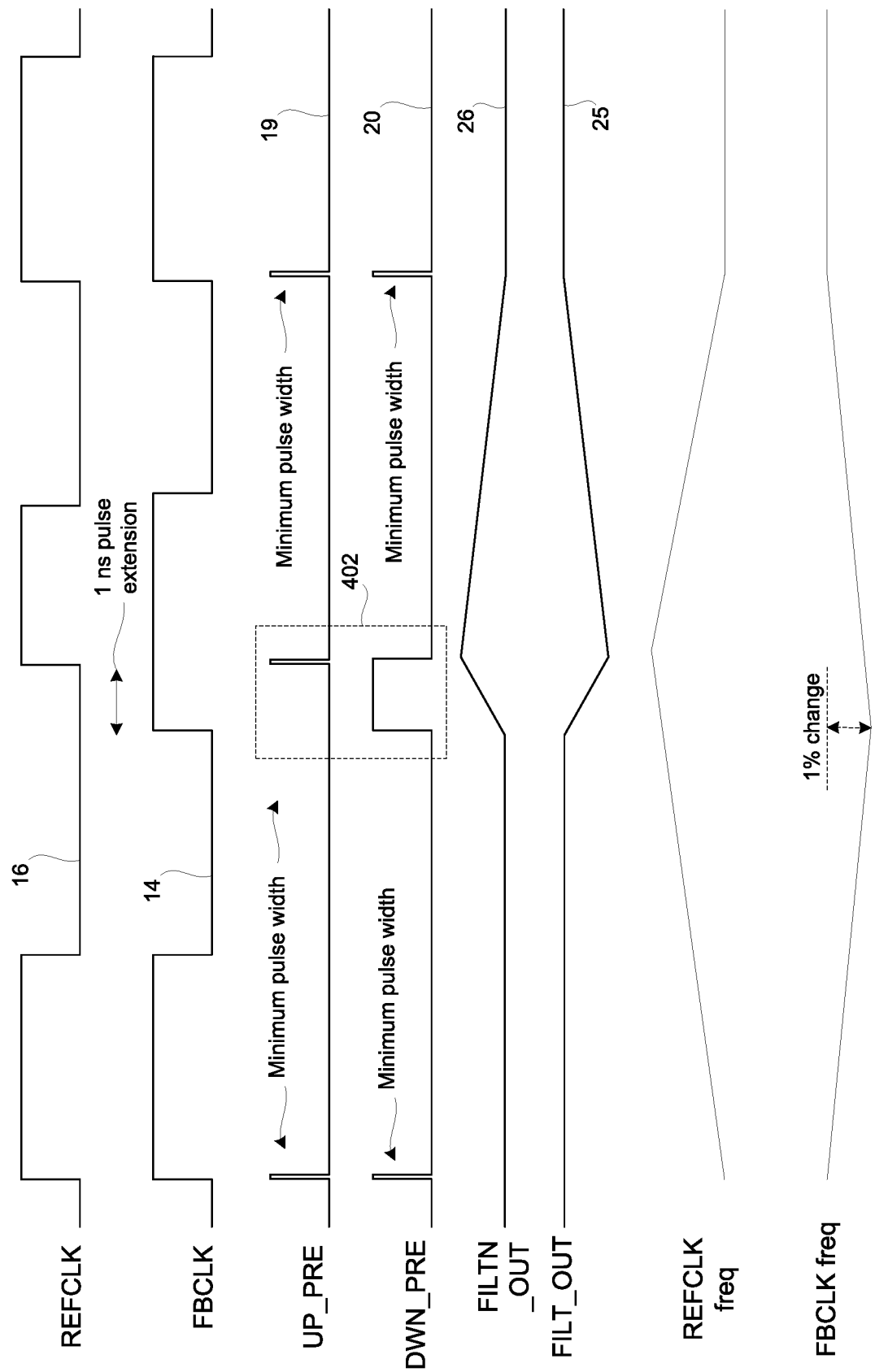
FIG. 5 is a waveform response of a phase locked loop that does not include the pulse limiter that is described in accordance with one or more embodiments.

FIG. 5 is a exemplary waveform response of phase locked loop 100 with TRUNC_EN signal 29 logically set at false, low, "0", or the like, thereby indicating that truncation is disabled. Phase locked loop 100 will respond to the 1 nanosecond REFCLK signal 16 pulse extension with a 1 nanosecond DWN_PRE pulse 20 (i.e., arrow 402) and a 40 picosecond (e.g., phase frequency detector 102 minimum pulse width) UP_PRE pulse 19 (i.e., arrow 404). This large DWN_PRE pulse 20 results in an exemplary 280 mV voltage controlled oscillator 110 control voltage shift and an exemplary 1 Mhz (1%) change in FBCLK 14 frequency. Known downstream clock and data recovery circuit(s) would likely not be able to track an instantaneous FBCLK 14 frequency change of 1% and would likely result in a need for a cyclic redundancy check (CRC).

Figure 6:
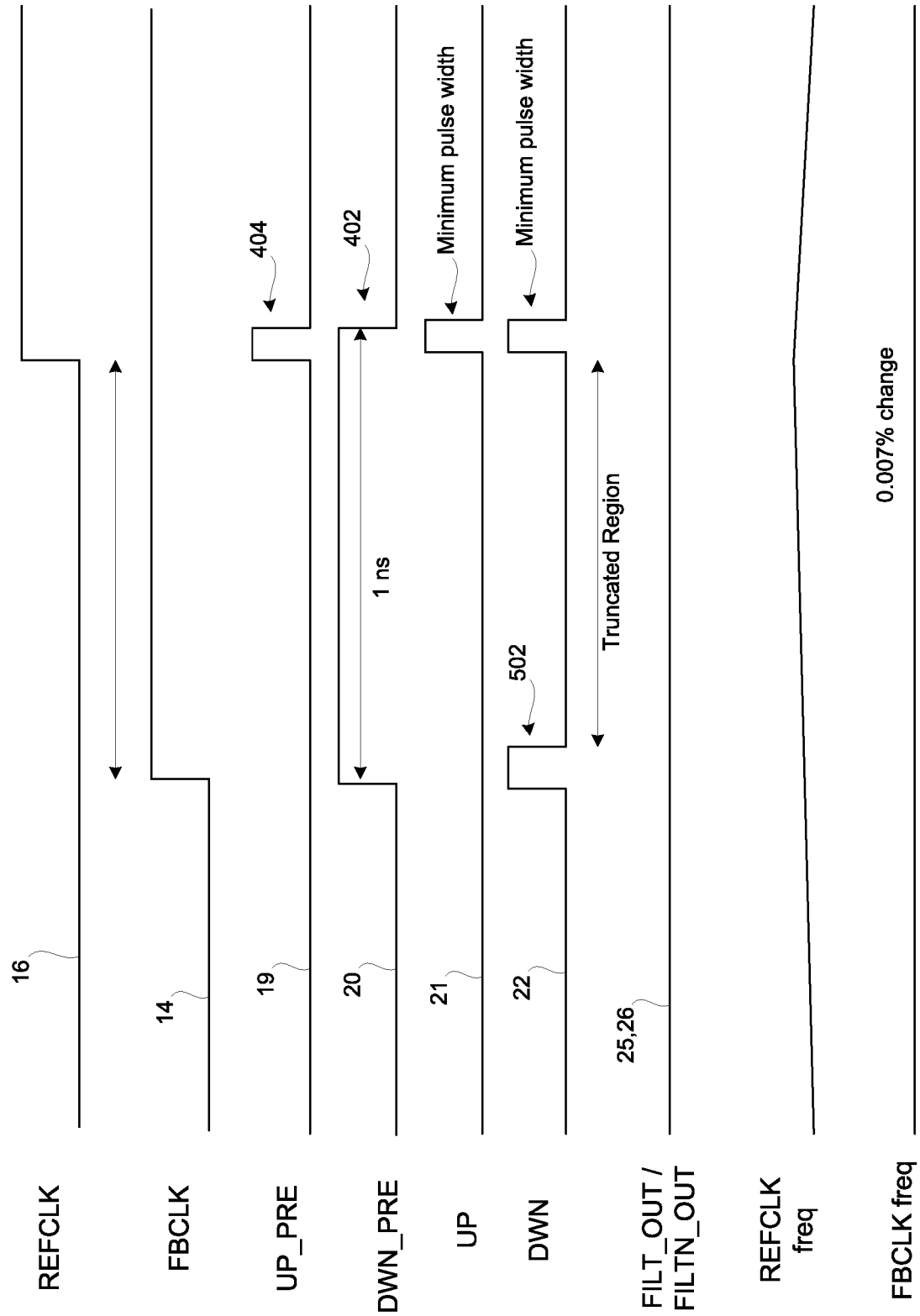
FIG. 6 is a waveform response of a phase locked loop that includes the pulse limiter that is described in accordance with one or more embodiments.

FIG. 6 is an exemplary waveform response of phase locked loop 100 with TRUNC_EN signal 29 logically set at true, high, "1", or the like, thereby indicating that truncation is enabled. In the exemplary depicted waveform response, pulse limiter 104 is configured to tap from the 5th buffer 220 (i.e., stage five buffer output signal 221 is selected by delay select 32 signal to be the delayed DLYSTAGE signal 245) which corresponds to a corresponding delay (e.g., an approximate 50 picosecond delay, etc.). As such, pulse limiter 104 is set to truncate any UP_PRE pulse 19 width or any DWN_PRE pulse 20 that is greater than the set corresponding delay plus the phase frequency detector 102 minimum pulse width. The corresponding delay may be the intended pulse width of the truncated UP pulse 21 and the truncated DWN pulse 22. In the depicted example, therefore, pulse limiter 104 is set to truncate any UP_PRE pulse 19 width or any DWN_PRE pulse 20 that is greater than 90 picoseconds (i.e., the set corresponding delay of 50 picoseconds plus the phase frequency detector 102 minimum pulse width of 40 picoseconds).

The DEC_PRE pulse 20 (arrow 402) represents the DEC_PRE pulse 20 output of the phase frequency detector 102 and the DWN pulse 22 (arrow 502) represents the truncated output from pulse limiter 104. The 1 nanosecond DEC_PRE pulse 20 from the phase frequency detector 102 is sent into pulse limiter 104 and the resulting DWN pulse 22 (arrow 502) is reduced to 50 nanoseconds. Also notice phase frequency detector 102 minimum pulse width of 40 picoseconds may be propagated through the phase locked loop 100 untouched (e.g., 40 picoseconds, or the like)). The pulse limiter 104 truncation of the DEC_PRE pulses 20 and the UP_PRE pulses 19 in such a manner may exemplarily result in a smaller 27 mV (e.g., order of magnitude, etc.) voltage controlled oscillator 110 control voltage shift and an exemplary smaller change of 7 khz, or a 0.007% change, (e.g., many orders of magnitude less of a change) in FBCLK 14 frequency.

Figure 7:
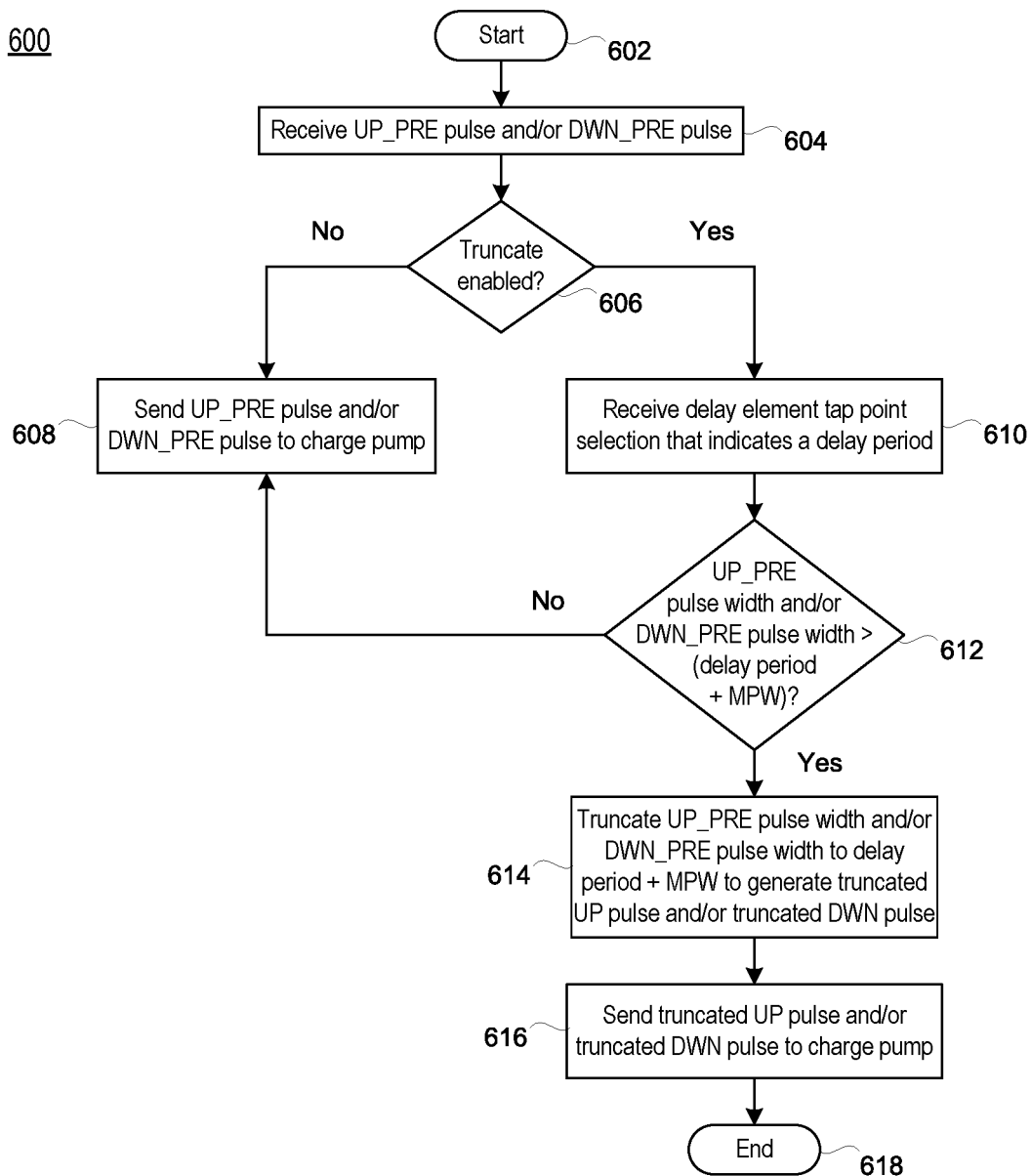
FIG. 7 is a block diagram illustrating a phase locked loop pulse truncation method, in accordance with one or more embodiments.

FIG. 7 is a block diagram illustrating a phase locked loop pulse truncation method 600, in accordance with one or more embodiments. Method 600 may be utilized by phase locked loop 100 that includes pulse limiter 104 and may begin at block 602. Method 600 may continue with phase frequency detector 102 generating and sending an UP_PRE pulse 19 and/or a DWN_PRE pulse 20 to pulse limiter 104 and pulse limiter 104 receiving the sent UP_PRE pulse 19 and/or sent DWN_PRE pulse 20 (block 604).

Method 600 may continue with determining whether truncation is enabled (block 606). For example, truncation may be enabled with enable signal 31 indicates that truncation is enabled. Enable signal 31 may indicate that truncation is disabled when PLL 100 is converging to its locked state and enabled when PLL 100 is locked.

Method 600 may continue with pulse limiter 104 sending the received UP_PRE pulse 19 and/or received DWN_PRE pulse 20 to charge pump 106, if truncation is disabled (block 608). Alternatively, if truncation is enabled, method 600 may continue with pulse limiter 104 determining whether the received UP_PRE pulse 19 width and/or the received DWN_PRE pulse 20 width is greater than a prespecified delay period plus the minimum pulse width of phase frequency detector 102 (block 612). The prespecified delay period may be associated with a particular delay buffer that is selected amongst the one or more delay buffers 280 of the single block 260 or series of delay elements that is associated with delay select 32 signal.

If the received UP_PRE pulse 19 width and/or the received DWN_PRE pulse 20 width is less than or equal to the prespecified delay period plus the minimum pulse width of phase frequency detector 102, method 600 may continue with returning to block 608. Alternatively, if the received UP_PRE pulse 19 width and/or the received DWN_PRE pulse 20 width greater than the prespecified delay period plus the minimum pulse width of phase frequency detector 102, method 600 may continue with truncating the received UP_PRE pulse 19 width and/or the received DWN_PRE pulse width to a width of or associated with the prespecified delay period plus the minimum pulse width of phase frequency detector 102, thereby generating a truncated UP pulse 21 and/or a truncated DWN pulse 22, respectively (block 614). Method 600 may continue with pulse limiter 104 sending the truncated UP pulse 21 and/or the truncated DWN pulse 22 to charge pump 106 (block 616) and may end at block 618

The flowcharts and block diagrams in the drawings may illustrate the architecture, functionality, or operations of possible implementations of systems, methods, or devices according to various embodiments of the present invention. In this regard, each block in the flowchart or block diagrams may represent a module, segment, or portion of circuits or circuit systems. In some alternative implementations, the functions noted in the flowchart block may occur out of the order noted. For example, two blocks shown in succession may, in fact, be executed substantially concurrently, or the blocks may sometimes be executed in the reverse order, depending upon the functionality involved.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. A phase locked loop comprising:

a first delay element that receives a UP_PRE clock pulse from a phase frequency detector and a second delay element that receives a DWN_PRE clock pulse from the phase frequency detector;

a XOR gate that receives the UP_PRE clock pulse and the DWN_PRE clock pulse and generates an XOR output that indicates if UP_PRE clock pulse or the DWN_PRE is greater than a minimum pulse width of the phase frequency detector;

a plurality of delay buffers electrically connected in series to the XOR gate;

a multiplexer that outputs a delay stage signal that indicates a truncated pulse width as the minimum pulse width of the phase frequency detector plus a delay period that is associated with a delay buffer selection signal that identifies one of the plurality of delay buffers;

a first AND gate, electrically connected to the first delay element, that outputs a truncated UP clock pulse comprising the truncated pulse width to a charge pump; and a second AND gate, electrically connected to the second delay element, that outputs a truncated DWN clock pulse comprising the truncated pulse width to the charge pump.

2. The phase locked loop of claim 1, further comprising a NAND gate that receives the delay stage signal, that receives the XOR output, and that receives a truncation enable signal and generates a NAND output that is sent to the first AND gate and to the second AND gate.

3. The phase locked loop of claim 2, wherein the plurality of delay buffers comprise a plurality of non-selectable delay buffers that are not selectable by the delay buffer selection signal and a plurality of selectable delay buffers that are selectable by the delay buffer selection signal.

4. The phase locked loop of claim 3, wherein the XOR gate is electrically connected in series to a first non-selectable buffer.

5. The phase locked loop of claim 4, wherein the pulse limiter further comprises:

a first latch that determines and stores a UP truncation signal that indicates that the UP_PRE clock pulse was truncated by the first AND gate outputting the truncated UP clock pulse to the charge pump.

6. The phase locked loop of claim 5, wherein the pulse limiter comprises:

a second latch that determines and stores a DWN truncation signal that indicates that the DWN_PRE clock pulse was truncated by the second AND gate outputting the truncated DWN clock pulse to the charge pump.

7. The phase locked loop of claim 6, wherein the first latch receives the UP_PRE clock pulse, receives a logical inverse of the NAND output, and receives a logical inverse of the truncation enable signal.

8. The phase locked loop of claim 7, wherein the second latch receives the DWN_PRE clock pulse, receives the logical inverse of the NAND output, and receives the logical inverse of the truncation enable signal.

* * * * *